(12) United States Patent
Roach

(10) Patent No.: US 6,975,658 B1
(45) Date of Patent: Dec. 13, 2005

(54) GAIN NORMALIZATION FOR AUTOMATIC CONTROL OF LIGHTWAVE EMITTERS

(75) Inventor: Steven D. Roach, Colorado Springs, CO (US)

(73) Assignee: Linear Technology Corporation, Milpitas, CA (US)

(*) Notice: Subject to any disclaimer, the term of this patent is extended or adjusted under 35 U.S.C. 154(b) by 307 days.

(21) Appl. No.: 10/173,452

(22) Filed: Jun. 13, 2002

(51) Int. Cl.$^7$ ................................................ H01S 3/13
(52) U.S. Cl. ................................ 372/29.02; 372/29.01
(58) Field of Search ............ 372/29.011, 29.01–29.016, 372/29.02–33, 32, 38.02, 29.021; 330/254; 327/356

(56) References Cited

U.S. PATENT DOCUMENTS

| | | | |
|---|---|---|---|
| 3,573,644 A | | 4/1971 | Evel ................................ 330/9 |
| 4,247,789 A | * | 1/1981 | Cate et al. .................... 327/356 |
| 4,796,266 A | * | 1/1989 | Banwell et al. ........ 372/29.021 |
| 5,068,864 A | * | 11/1991 | Javan ............................ 372/32 |
| 5,121,075 A | | 6/1992 | Roach .......................... 330/126 |
| 5,157,350 A | * | 10/1992 | Rubens ........................ 330/254 |
| 6,175,579 B1 | * | 1/2001 | Sandford et al. ............. 372/32 |
| 6,351,476 B2 | * | 2/2002 | Kner et al. .................... 372/32 |
| 6,370,170 B1 | * | 4/2002 | Glance ........................... 372/32 |
| 6,560,253 B1 | * | 5/2003 | Munks et al. .................. 372/32 |
| 6,590,915 B1 | * | 7/2003 | Kitaoka et al. .......... 372/38.02 |
| 6,696,888 B2 | * | 2/2004 | Gilbert ........................ 327/560 |

OTHER PUBLICATIONS

Addis, John, "Three technologies on one chip make a broadband amplifier", *Electronics The International Magazine of Electronics Technology*, Jun. 5, 1972, pp. 103-107.
Ahuja, B.K., "Implementation of Active Distributed RC Anti-Aliasing/Smoothing Filters", *IEEE Journal of Solid-State Circuits*, vol. SC-17, No. 6, pp. 339-342.
AMCO Product Brief 1.0/1.25GBPSVCSELDRIVER, May 10, 1999, pp. 1-3.
Dascher, David J., "Measuring Parasitic Capacitance and Inductance Using TDR", *Hewlett-Packard Journal*, Apr. 1996, pp. 1-19.
Ikalainen, Pertti, K. "An RLC Matching Network and Application in 1-20 GHZ Monolithic Amplifier", *IEEE MTT-S International Microwave Symposium Digest*, vol. I, 1989, pp. 1115-1118.
Khoury, John, M., "Synthesis of Arbitrary Rational Transfer Funtions is S Using Uniform Distributed RC Active Circuits", IEEE Transactions on Circuits and Systems, vol. 37, No. 4, Apr. 1990, pp. 464-472.
Khoury, John, M., "On the Design of Constant Settling Time AGC Circuits", *IEEE Transactions on Circuits and Systems*, vol. 45, No. 3, Mar. 1998, pp. 283-194.
Maxium, "Interfacing Maxim Laser Drivers with Laser Diodes", May 2000, pp. 1-2.
Sackinger, Eduard, et al., "A 3GHz, 32dB CMOS Limiting Amplifier for SONET OC-48 Receivers", *IEEE International Solid-State Circuits Conference*, 2000, p. 158.

(Continued)

*Primary Examiner*—Minsun Oh Harvey
*Assistant Examiner*—Tuan N. Nguyen
(74) *Attorney, Agent, or Firm*—Fish & Neave IP Group of Ropes & Gray LLP; Robert W. Morris; Jeffrey D. Mullen

(57) ABSTRACT

Circuits and methods for automatically controlling lightwave emitters are provided. A control system is provided that includes a variable gain circuit for automatically adjusting the gain of a control signal with respect to a feedback signal, a modulation signal, and a reference signal. This allows the optical output of the lightwave emitter to remain substantially constant despite changes in transfer ratio due to aging or temperature variations. Furthermore, in some embodiments, a user may select the overall gain of the system to optimize response time, bandwidth, or steady-state accuracy.

55 Claims, 10 Drawing Sheets

OTHER PUBLICATIONS

SUMMIT Microelectronics, Inc. "Dual Loop Laser Diode Adaptive Power Controller with Look Up Table" (SML2108), Oct. 3, 2001, pp. 1-21.

Swartz, R.G. et al., "An Integrated Circuit for Multiplexing and Driving Injection Lasers", *IEEE Journal of Solid-State Circuits,* vol. SC-17, No. 4, Aug. 1982, pp. 753-760.

* cited by examiner

GAIN NORMALIZATION FOR AUTOMATIC CONTROL OF LIGHTWAVE EMITTERS

BACKGROUND OF THE INVENTION

This invention relates to automatic power control of light sources. More particularly, this invention relates to gain normalization and automatic power control of modulated light sources.

Recently, there has been a dramatic increase in the number of technologies that are based on the transmission of lightwave signals. Some popular examples of these technologies include data retrieval systems such as DVDs, data transfer systems such as fiber optics, and data acquisition systems such as bar code scanners. Generally speaking, lightwave systems are desirable because they take advantage of the unique properties of light such as extended bandwidth, the ability to propagate long distances with little loss, and resistance to electro-magnetic interference (EMI).

Lightwave technology has revolutionized the transmission of electronic information. For example, fiber optic communications systems that use semiconductor lasers can attain data rates far in excess of that normally found in copper wire systems. Because the light intensity of a semiconductor laser is usually linearly proportional to an injected current, and the current in a photodetector is linearly proportional to incident optical intensity, data may transmitted as a modulation of the optical intensity. Such a lightwave system is analogous to a linear electrical link where current or voltage translates linearly into optical intensity. High speed semiconductor lasers and photodetectors enable intensity-modulation bandwidths greater than 10 GHz, allowing the development of a wide variety of radio and microwave frequency applications.

Converting microwaves into intensity-modulated light allows the use of optical fiber for transmission in place of bulky inflexible coaxial cable or microwave waveguide. Because signal attenuation in optical fiber is much less that of cable or waveguide, entirely new applications and architectures are possible. In addition, optical signals are usually tightly confined to the core of single-mode fiber, where it is immune to EMI, cross talk, or spectral regulatory control.

To achieve these advantages, several limitations must be overcome. The conversion of current to light intensity must be substantially linear. Several nonlinear mechanisms must be avoided by proper laser design or by the use of various linearization techniques.

An example of a conventional lightwave transmission system 10 with automatic power control is shown in FIG. 1. Transmission system 10 includes a lightwave emitter 110, a lightwave detector 120, a summing node 130, a reference signal 140, a fixed gain circuit 20, a modulator circuit 160, and an optical transmission medium 170.

In operation, a drive signal $I_D$ is applied to lightwave emitter 110 so that emitter 110 produces optical output signal 115. Optical output signal 115 is the principal output signal of circuit 10 which may be used to as optical data. As shown, principal signal 115 is applied to an optical transmission medium 170 for conveying the optical information. Another optical signal, monitor signal 116, is also generated. Signal 116 may be created directly by lightwave emitter 110 or by sampling a portion of principal output signal 115. Monitor signal 116 is applied to lightwave detector 120 to monitor the power of principal signal 115. This is accomplished by generating a feedback signal $I_{FB}$ that is representative of monitor signal 116. Principal signal 115 and monitor signal 116 are usually proportional to one another so the feedback signal $I_{FB}$ is proportionally related to principal signal 115.

As shown in FIG. 1, both feedback signal $I_{FB}$ and reference signal 140 ($I_{REF}$) are coupled to summing node 130. Summing node 130 compares the feedback signal and the reference signal in order to produce a control signal $I_C$ that is proportional to the difference of these signals (sometimes referred to as an error signal). Fixed gain circuit 20, which is typically an integrator, receives control signal $I_C$ and produces a bias signal $I_B$ in order to maintain emitter 110 at a power level that allows effective modulation. Bias signal $I_B$ is subsequently combined with modulation signal $I_M$, which includes modulated information, to produce a drive signal $I_D$ that controls the output of lightwave emitter 110. In this way, the optical output of lightwave emitter 110 provides modulated optical communication signals to transmission medium 170.

When drive signal $I_D$ is initially applied to lightwave emitter 110, system 10 experiences wide variations in operating parameters. Three parameters of particular concern to circuit designers are the threshold level and slope efficiency of emitter 110 and the sensitivity of detector 120.

The threshold level of emitter 110 is generally defined as the magnitude of the drive signal $I_D$ required to produce a desired minimum light level. The slope efficiency of emitter 110 is generally defined as the derivative of optical output signal 115 with respect to the input signal ($I_D$) when the input signal is above the threshold level. The sensitivity of detector 120 is generally defined as the ratio of the average value of the output signal (in this case the average value $I_{FB}$) to the average optical output power (in this case, the average value of optical output signal 115).

The threshold level is indicative of the level above which lightwave emitter 110 generates a useful optical output signal. Maintaining emitter 110 above this threshold level is generally desirable in optical transmission systems because it reduces the response time of emitter 110 to drive signal $I_D$, minimizes the amplitude of $I_M$ needed to produce the required optical modulation, and reduces duty cycle distortion.

The slope efficiency is representative of the amount of light produced by emitter 110 per unit drive signal $I_D$. The value the slope efficiency directly affects the amplitude of the modulation signal $I_M$ needed to produce the necessary optical modulation.

Initially, it is necessary to compensate for variations in the threshold level and slope efficiency of light emitter 110 and for variations in sensitivity of detector 120. This is usually accomplished during the final assembly of transmission system 10 by selecting appropriate values for the amplitude of modulation signal IM and reference signal 140. Typically, reference signal 140 is adjusted until the average optical power produced by lightwave emitter 110 conforms to a given communications standard such as one promulgated by the IEEE (e.g., ETHERNET). Similarly, the amplitude of modulation signal $I_M$ is adjusted until the extinction ratio (i.e., the ratio between maximum instantaneous optical output power and minimum instantaneous optical output power) of optical output signal 115 is sufficiently high to conform with a given communication standard.

Over time and with changes in temperature, variations in the threshold level and slope efficiency cause the average power of optical output signal 115 to change. Summing node 130 senses this change through a corresponding change in feedback signal $I_{FB}$ and modifies control signal $I_C$. This causes a change in bias signal $I_B$ to approximately correct for the change in optical output power. In this way, transmission system 10 maintains the average optical output power of lightwave emitter 110 approximately constant.

In addition to changes in average optical output power, a change in slope efficiency also adversely affects extinction ratio. This occurs because the change in slope efficiency changes the modulation amplitude of the optical output signal. This problem is commonly solved in system 10 by adjusting the amplitude of modulation signal $I_M$ to maintain the modulation amplitude of optical output signal 115 substantially constant.

One problem with system 10, however, is that variations in transfer ratio (i.e., the product of slope efficiency and detector sensitivity) reduce its ability to maintain the power of optical output signal 115 constant. In general, the accuracy with which any feedback control system, such as system 10, can maintain its output in proportion to its input is limited by its loop gain. High loop gain is required for high accuracy, but excessive loop gain causes stability problems. If the loop gain is too low, however, large errors will be encountered in controlling average optical power. Because the loop gain in system 10 is dependent on the transfer ratio, the accuracy and stability of system 10 varies as transfer ratio varies. Thus, as transfer ratio decreases, system accuracy is sacrificed, and when transfer ratio increases, stability is compromised.

System 10 experiences a decrease in transfer ratio due to initial manufacturing tolerances of emitter 110 and detector 120 and to drift in emitter 110. This causes several problems. Foremost among these is a decrease in system bandwidth which results in an undesirably long settling time when emitter 110 is turned on. If settling time is excessive, it takes too long to turn on and stabilize emitter 110. However, if bandwidth is too large, the servo loop (i.e., the circuitry that controls emitter 110) will attenuate low frequency content in the communications signal. Thus, such an overlap is undesirable.

To deal with these well known performance limitations, international standard agencies such as the IEEE have adopted communication protocols that allow for very long settling times and attempt to minimize the overlap problem by requiring the use of high overhead encoding schemes such as 8B10B. Such long settling times however, make burst transmissions, which save electrical power and improve eye safety, virtually impossible. Moreover, this solution prevents accurate data transfer during the start up period and significantly reduces overall data rates.

Thus, in view of the foregoing, it would be desirable to provide a system and method for gain normalization and automatic power control for modulated light sources that overcomes the above-described and other deficiencies found in conventional systems.

SUMMARY OF THE INVENTION

It is therefore an object of the present invention to provide circuits and methods for improving control of modulated light sources.

This and other objects of the present invention are accomplished in accordance with the principles of the present invention by providing circuits and methods automatically controlling lightwave emitters. A control system is provided that includes a variable gain circuit for automatically adjusting the gain of a control signal with respect to a feedback signal, a modulation signal, and a reference signal. This allows the optical output of the lightwave emitter to remain substantially constant despite changes in transfer ratio due to aging or temperature variations. Furthermore, in some embodiments, a user may select the overall gain of the system to optimize response time, bandwidth, or steady-state accuracy.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE PREFERRED EMBODIMENTS

Figure 1:
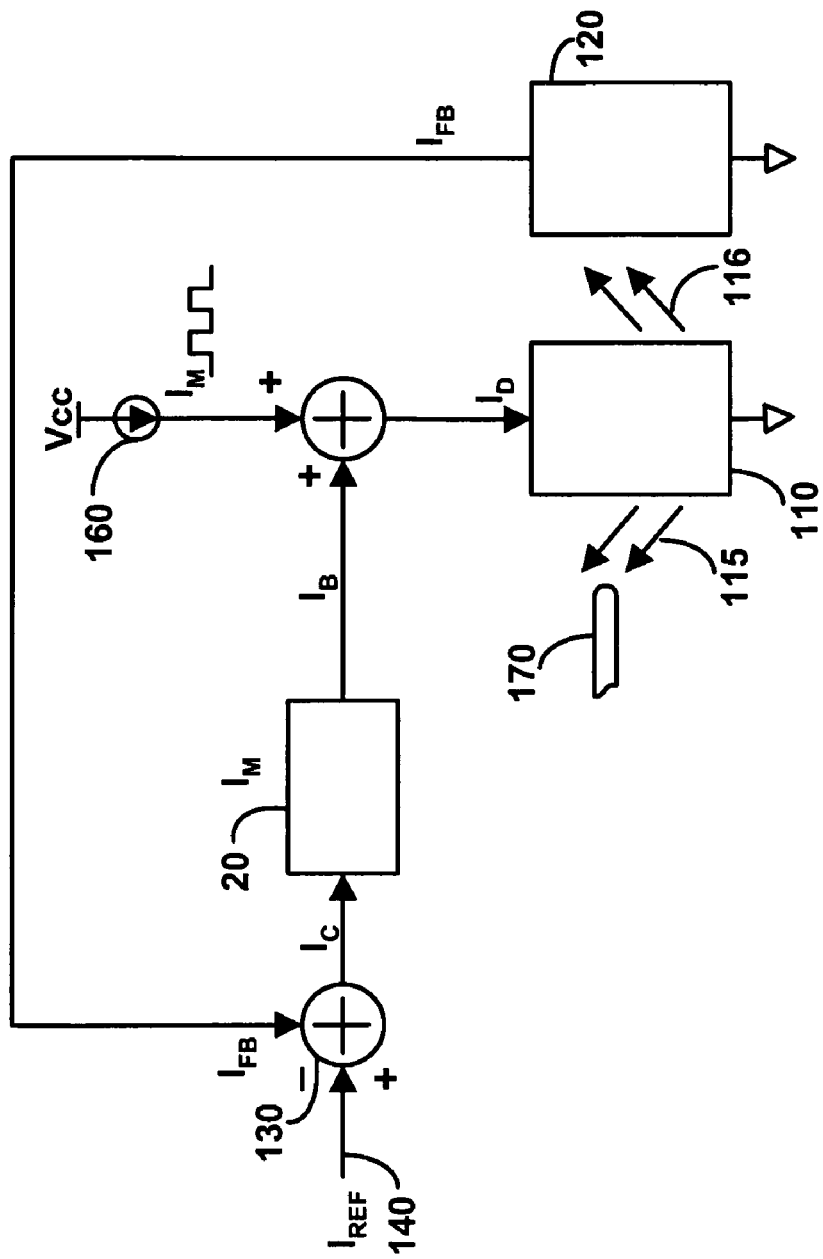
FIG. 1 is a block diagram of a conventional lightwave transmission system with automatic power control.
Figure 2:
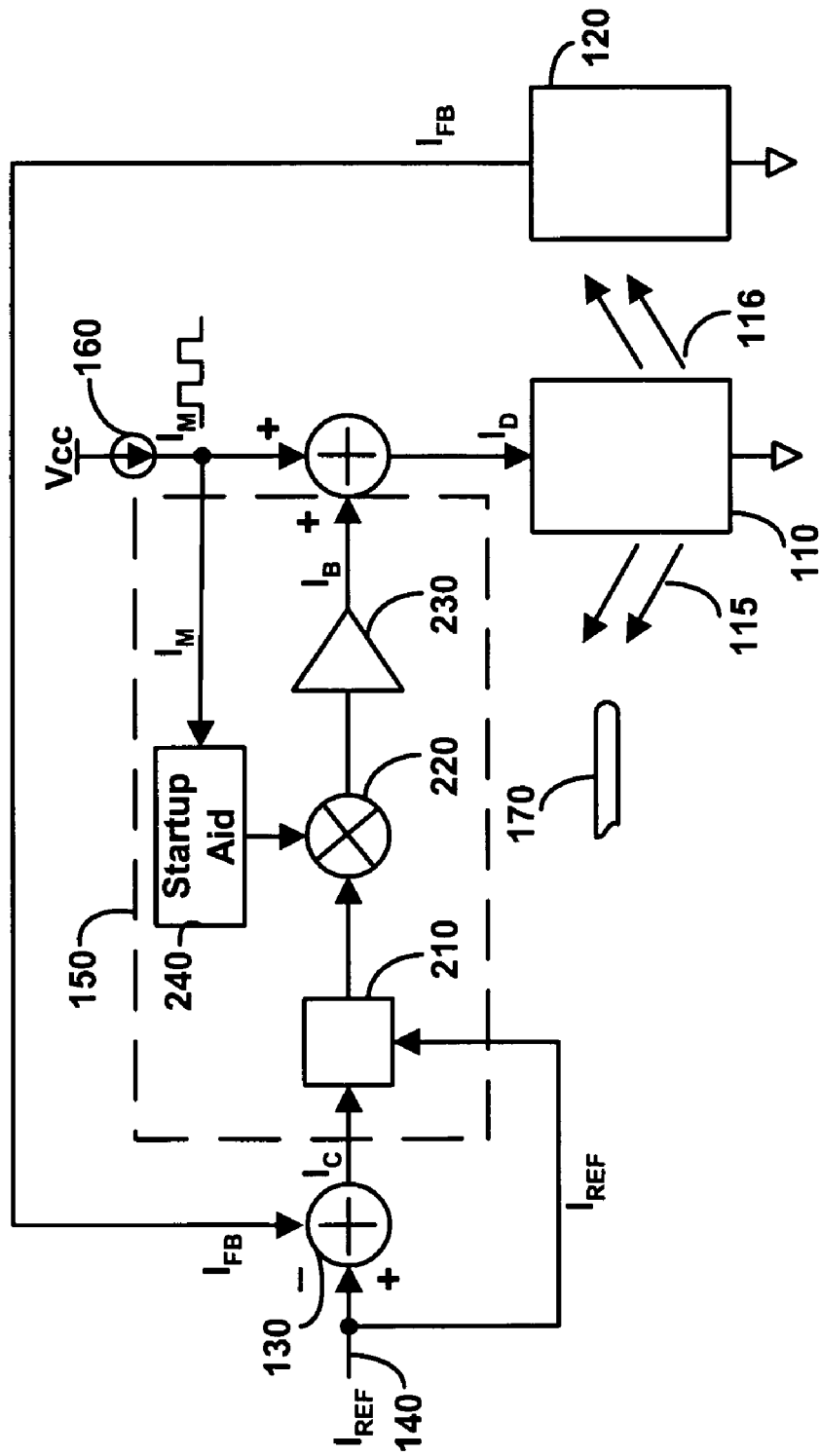
FIG. 2 is a block diagram of a lightwave transmission system with automatic power control constructed in accordance with the principles of the present invention.

A gain normalization system 100 constructed in accordance with the principles of the present invention is shown in FIG. 2. As in FIG. 1 gain normalization system 100 includes a lightwave emitter 110, a lightwave detector 120, a summing node 130, a reference signal 140, a modulator circuit 160, and optionally, may be coupled to optical transmission medium 170.

Lightwave emitter 110 may be any suitable controlled lightwave emitting source such as a laser, a laser diode, a vertical cavity surface emitting laser (VCSEL), an edge emitting laser, a light emitting diode (LED), etc. Lightwave detector 120 may be any detector suitable for detecting light such as a photodiode, a phototransistor, a photoelectric detector, a charge coupled device (CCD), etc.

Gain normalization system 100 has been improved as compared to the system shown in FIG. 1, however, by replacing fixed gain circuit 20 with variable gain circuit 150. As can be seen, circuit 150 is coupled to modulator 160 and reference signal $I_{REF}$. This arrangement allows the gain of circuit 150 to be varied with respect to the amplitude of modulation signal $I_M$ and with respect to reference signal $I_{REF}$. Two important benefits are realized by allowing the gain of circuit 150 to be varied. The first is that the loop gain of system 100 is no longer dependent on its transfer ratio. The second is that the loop gain may be set to a predetermined value that remains constant despite variations in transfer ratio.

To illustrate the benefit of setting and maintaining the loop gain to a predetermined constant value, the effect of the loop gain can be analyzed. Referring to FIG. 2, the loop gain is defined as the total small signal gain in the control loop, or $$A = dI_{FB}/dI_C = G(s) * dI_{FB}/dI_B \quad (1)$$

where s is the Laplace variable and G(s) is the Laplace transform of variable gain circuit 150.

It is well known from elementary control system theory that for infinite loop gain, $I_C = 0$, $I_{FB} = I_{REF}$, and therefore $$P_{115} = (I_{FB}/\gamma) = I_{REF}/\gamma \quad (2)$$

where γ is the detector sensitivity or $$\gamma = I_{FB}/P_{115} \quad (3)$$

It can also be shown from elementary control theory that for finite loop gain $$P_{115} = I_{REF}/\gamma * [A/(1+A)] \quad (4)$$

If the variable gain circuit 150 is an integrator, as is commonly the case, the loop gain of the system 100 may be expressed as $$A = A(s) = A_0/(s*\tau) \quad (5)$$

where A(s) is the Laplace transform of the loop gain. Combining equations 4 and 5 the optical output signal power can be written as $$P_{115} = (I_{REF}/\gamma)/(1 + s*\tau/A_0) \quad (6)$$

Equation 6 represents a single-pole low pass filter with an effective time constant of $$\tau_O = \tau/A_O \quad (7)$$

and 3 dB bandwidth $$\omega_{O=1}/\tau_O = A_O/\tau \quad (8)$$

If Ao in equation 2 is a user selectable design parameter and may be chosen as a constant, then the effective time constant to and the 3 dB bandwidth $\omega_o$ are also user selectable constants. This allows the system designer to set these parameters to certain values based on design requirements.

Figure 3:
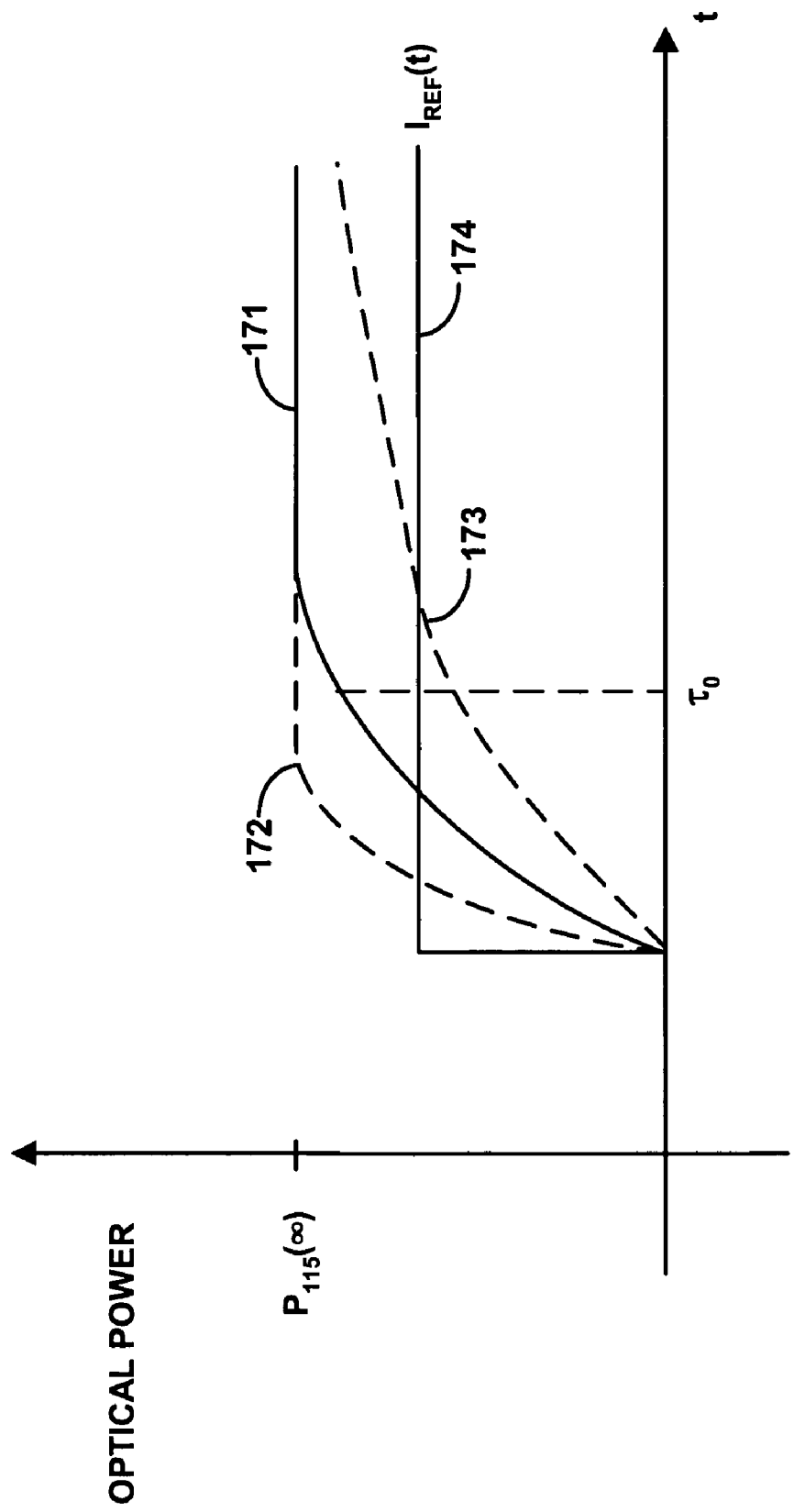
FIG. 3 is graph illustrating how the response time of the system shown in FIG. 2 is affected by loop gain when a step change is applied to the reference signal.

FIG. 3 is a graph that illustrates how response time is affected by loop gain when a step change is applied to the reference signal (shown in FIG. 3 as solid line 174, $I_{REF}$(t)). This closely parallels the behavior of system 100 when it is turned on. Because Ao is a selectable design parameter, a designer may choose a specific gain value for system 100 to obtain a specific response time. For example, a designer may choose Ao to be relatively large in order to obtain a faster response time. This is illustrated by dotted line 172. If slower response times are desired, smaller values of Ao may be chosen to obtain the response times represented by solid line 171 and dotted line 173. In this way, component manufacturers may select gain values specific to each component so that response times for a particular component type are substantially constant. Thus, one advantage of the present invention is that it permits the production of multiple systems 100 that have substantially the same response time. This is a dramatic improvement over prior art techniques that select a nominal gain to obtain a range of response times that in the worst case fall within the upper and lower bound allowed by the communication protocol.

The ability to accurately set the response time of system 100 has important consequences in the frequency domain.

Figure 4:
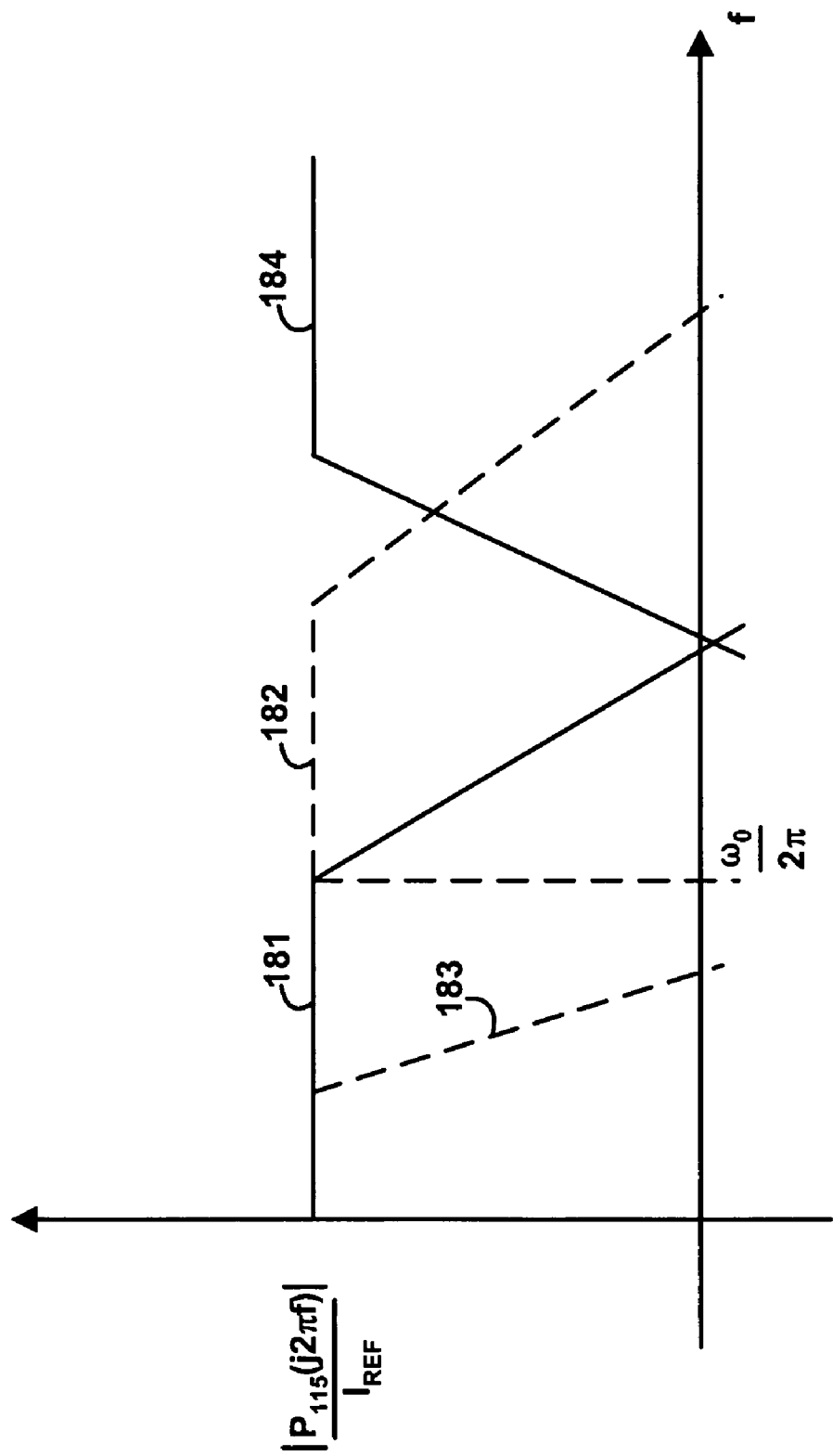
FIG. 4 is a frequency plot of three possible response times of the system shown in FIG. 2 compared with the spectrum of a modulation signal.

FIG. 4 is a frequency plot of three system response times compared with the spectrum of modulation signal $I_M$. In FIG. 4, solid line 181 and dotted lines 182 and 183 represent frequency response plots that correspond to the system responses shown in FIG. 3. For example, dotted line 182 is a frequency response plot of the response time represented by dotted line 172, and solid line 181 is a frequency response plot of the response time represented by solid line 171, etc.

As can be seen from FIG. 4, selecting a fast response time results in the frequency characteristic depicted by dotted line 182, whereas selecting slower response times results in the frequency characteristics depicted by solid line 181 and dotted line 183. Because the system designer can control response time, the frequency response profile of system 100 is also controllable. This enables the designer to tailor the frequency response profile of system 100 to meet operational requirements. In particular, the bandwidth of system 100 should not be too low or the system would fail to meet settling time requirements at startup. Also, the bandwidth of system 100 should not overlap the low frequency portion of the spectrum of the modulation signal $I_M$, shown as solid line 184, or it would suppress the low frequency content of the modulation signal.

In a digital optical communications system, for example, it may be desirable to use a low-overhead data encoding scheme that allows long consecutive strings of high or low signal levels and has a relatively high portion of its total energy concentrated at low frequencies. In this case, a slower system response time (i.e., lower bandwidth) is preferred to prevent the control loop bandwidth from overlapping with the modulation signal spectrum.

In other applications, however, such as short-duration, high speed communications, or in power sensitive applications where system 100 is turned on and off frequently, it is generally desirable to have system 100 respond as fast as possible in order to properly bias emitter 100 for data transmission. Furthermore, the more rapidly system 100 can establish stable bias of the light emitter the sooner the system can enable any safety fault mechanisms. However, it is well known that if the response time of system 100 is too fast, distortion results in the modulation portion of optical output signal 115.

FIG. 2 is somewhat similar to the prior art system in FIG. 1 in its overall operation but contains a different set of signal processing functions within variable gain circuit 150. Within circuit 150 the $I_{REF}$ and $I_M$ signals are used to normalize the overall loop gain to a constant value independent of the characteristics of lightwave emitter 110 and lightwave detector 120. The signal $I_M$ entering variable gain circuit 150 is generally the peak-to-peak value of the modulation signal $I_M$ that is delivered to light emitter 110. Circuit block 210 divides signal $I_C$ by $I_{REF}$ as required by equation 26 below. Startup aid 240 ensures that the input to multiplier 220 is above zero and therefore that the control loop gain is above zero. Startup aid 240 may be omitted if $I_M$ is above zero during setup and normal operation. Amplifier block 230 may be implemented as a pure integrator, as a proportional-integral-derivative (PID) circuit, or any other suitable arrangement. In certain embodiments, the gain of circuit 150 may be bounded such that it does not drop below a minimum value or exceed a maximum value. This may done to ensure stability and response time.

Startup aid 240 can be implemented in a variety of ways. Three examples of algorithms for implementing the startup aid 240 are as follows:

1: $S=I_M+C$
2: $S=\max(I_M, C)$
3: $S=$ if $I_M>0$ then $I_{MSET}$ else C where C is a constant number that is small relative to the nominal value of $I_M$. If C is made sufficiently small, the system will be stable for all expected values of current transfer ratio. C should be made sufficiently large so that the system settles rapidly enough to allow for setting $I_{REF}$ and therefore optical output signal 115 in a acceptable period of time.

The performance of system 100 in FIG. 2 can be quantified as follows. The response of the lightwave emitter to the bias current $I_B$ may be represented as $$P_{115}=\eta*(I_B-I_{TH}), I_B>I_{TH} \quad (9)$$

where $P_{115}$ is the average optical power coupled to transmission medium 170 and $I_{TH}$ is threshold current of light emitter 110. When $I_B$ is less than or equal to ITH, $P_{115}$ is essentially zero. The average value of the modulation current, $I_M$ in FIG. 2, may then be assumed to be zero, and does not change the average current in light emitter 110 or the average optical response.

From equation 2, the average photodiode current is $$I_{FB}=\gamma*P_{115} \quad (10)$$

Equations 9 and 10 can be combined to yield $$I_{FB}=\gamma*\eta*(I_B-I_{TH}) \quad (11)$$

or $$\gamma*\eta=I_{FB}/(I_B-I_{TH}) \quad (12)$$

According to equation 11, $I_{FB}$ is linearly dependent on the quantity $(I_B-I_{TH})$. Thus, the user may choose the value of $I_{FB}$ when evaluating the left-hand side of the equation. Choosing the steady state value for the control system 100 in FIG. 2 makes $I_{FB}=I_{REF}$. Thus, equation 12 can be written as $$\gamma*\eta=I_{REF}/(I_B-I_{TH}) \quad (13)$$

In equation 13, $I_B$ is the steady state bias current corresponding to $I_{FB}=I_{REF}$.

The small signal gain of the lightwave emitter-lightwave detector pair using equation 11 is $$dI_{FB}/dI_B=d/dI_B[\gamma*\eta*(I_B-I_{TH})]=\gamma*\eta \quad (14)$$

and using equation 13 is $$dI_{FB}/dI_B=I_{REF}/(I_B-I_{TH}) \quad (15)$$

The optical power emitted by the lightwave emitter in general is $$P=\eta*(I_D-I_{TH}) \quad (16)$$

where $I_D$ is the total, as opposed to the average, current delivered to the lightwave emitter. The optical power emitted during the transmission of a logic high signal is $$P_1=\eta*(I_1-I_{TH}) \quad (17)$$

and for a logic 0 or logic low signal $$P_0=\eta*(I_0-I_{TH}) \quad (18)$$

Where $I_D=I_1$ and $I_D=I_0$ are the values of total current delivered to lightwave emitter 110 for a logic 1 and a logic 0, respectively.

The extinction ratio is the ratio of the optical power transmitted for a logic 1 to that for a logic 0, or $$E_R=P_1/P_0=\eta*(I_1-I_{TH})/\eta*(I_0-I_{TH})=(I_1-I_{TH})/(I_0-I_{TH}) \quad (19)$$

Figure 10:
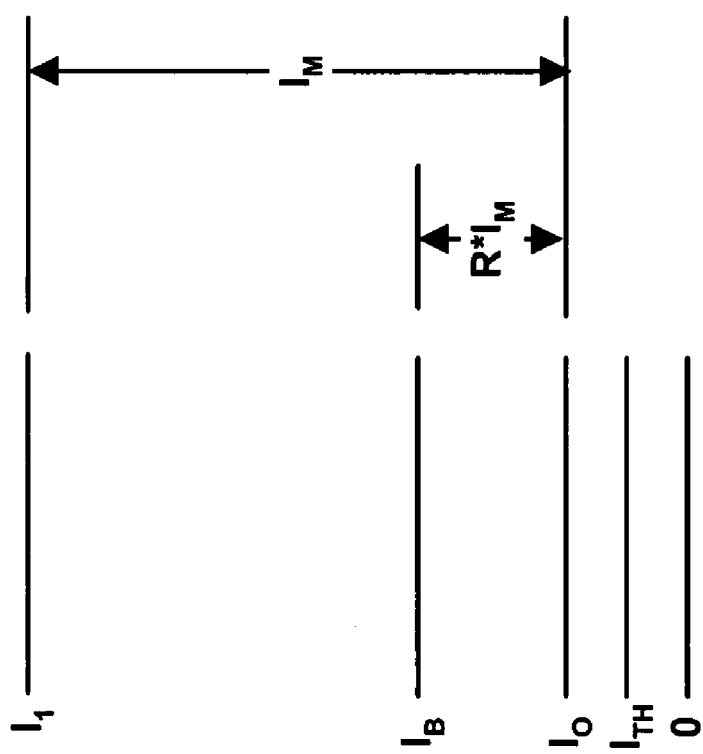
FIG. 10 is a diagram defining specific levels of current relevant to biasing and modulating a lightwave emitter.

From FIG. 10, it may be seen that $$I_M=I_1-I_0 \quad (20)$$

Thus, from equations 19 and 20 we can calculate $$E_R-1=(I_1-I_{TH})/(I_0-I_{TH})-1=(I_1-I_0)/(I_0-I_{TH})=I_M/(I_{0-ITH}) \quad (21)$$

It may also be seen from FIG. 10 that $$I_B=I_0+r*I_M \quad (22)$$

where r is the duty cycle of the digital signal being transmitted. Subtracting $I_{TH}$ from both sides of equation 22 gives $$I_B-I_{TH}=(I_0-I_{TH})+r*I_M \quad (23)$$

Combining equations 21 and 23

$$I_B-I_{TH}=I_M/(E_R-1)+r*I_M=I_M*[1/(E_R-1)+r] \quad (24)$$

Substituting equation 23 into equation 15

$$dI_{FB}/dI_B=I_{REF}/I_M*[1/(E_R-1)+r]^{-1} \quad (25)$$

Let G(s) in equation 1 be written as $$G(s)=A_O/(s*\tau)*I_M/I_{REF} \quad (26)$$

then from equations 1, 24, and 25 the loop gain is $$A=G(s)*dI_{FB}/dI_{FB}=[A_O/(s*\tau)*I_M/I_{REF}]*[I_{REF}/I_M*(1/(E_R-1)+r)]^{-1}=A_O/(S*\tau)*[1/(E_R-1)+r]^{-1} \quad (27)$$

Let $$\tau O=\tau/A_O*[1/(E_R-1)+r]^{-1} \quad (28)$$

and $$A=1/(s*\tau_O) \quad (29)$$

$\tau_O$ is completely independent of the highly variable parameters $\eta$ and $\gamma$. Furthermore, since ER and r are constants determined by the communications protocol, the effective time constant $\tau o$ is constant and can be chosen as a design parameter. These characteristics arise directly from equation 26 as a consequence of making the gain of variable gain amplifier proportional to the modulation current and inversely proportional to the reference current. Equation 26 may be further simplified by choosing $$A_{O=1}/(s*\tau_O) \quad (30)$$

With equation 30 equation 28 simplifies to $$\tau_O=\tau \quad (31)$$

and the time constant of the system is both constant and equal to the time constant of variable gain amplifier 150.

Figure 5:
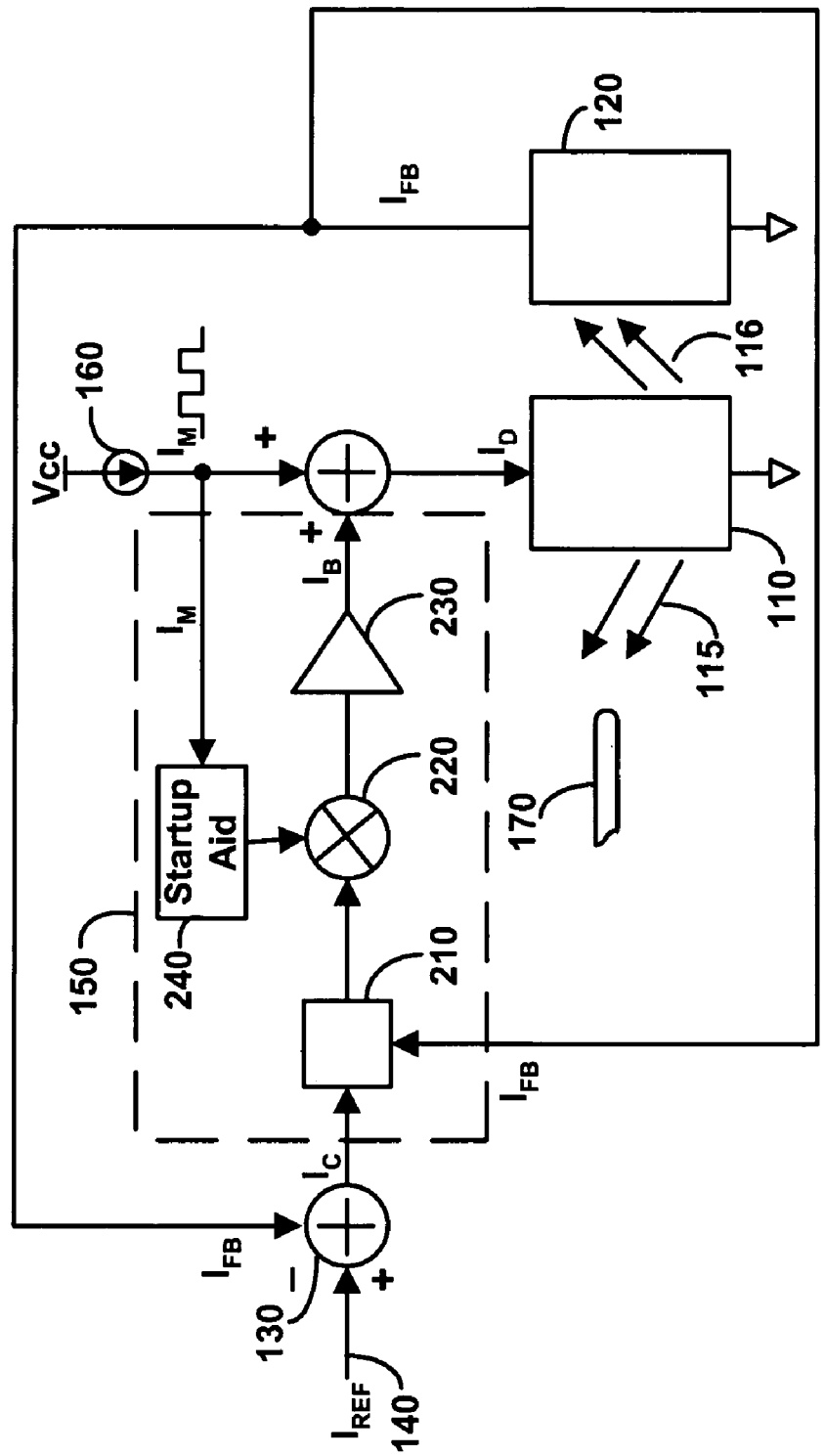
FIG. 5 is one possible alternate embodiment of the system shown in FIG. 2.

FIG. 5 shows one possible alternative embodiment 200 of the system shown in FIG. 2. In FIG. 5 block 210 receives an input from $I_{FB}$ instead of $I_{REF}$. Block 210 divides $I_C$ by $I_{FB}$ to normalize the overall loop gain to a substantially constant value. In steady state, when $I_{FB}=I_{REF}$, the loop dynamics, such as loop bandwidth, are approximately the same as system 100 once steady state is reached. System 200 settles faster than system 100 because the loop gain is boosted during settling when $I_{FB}$ is smaller than IREF. Block 210 is preferably configured to place a minimum limit on $I_{FB}$ so that it does not divide by zero and apply an infinitely large signal to multiplier 220.

Figure 6:
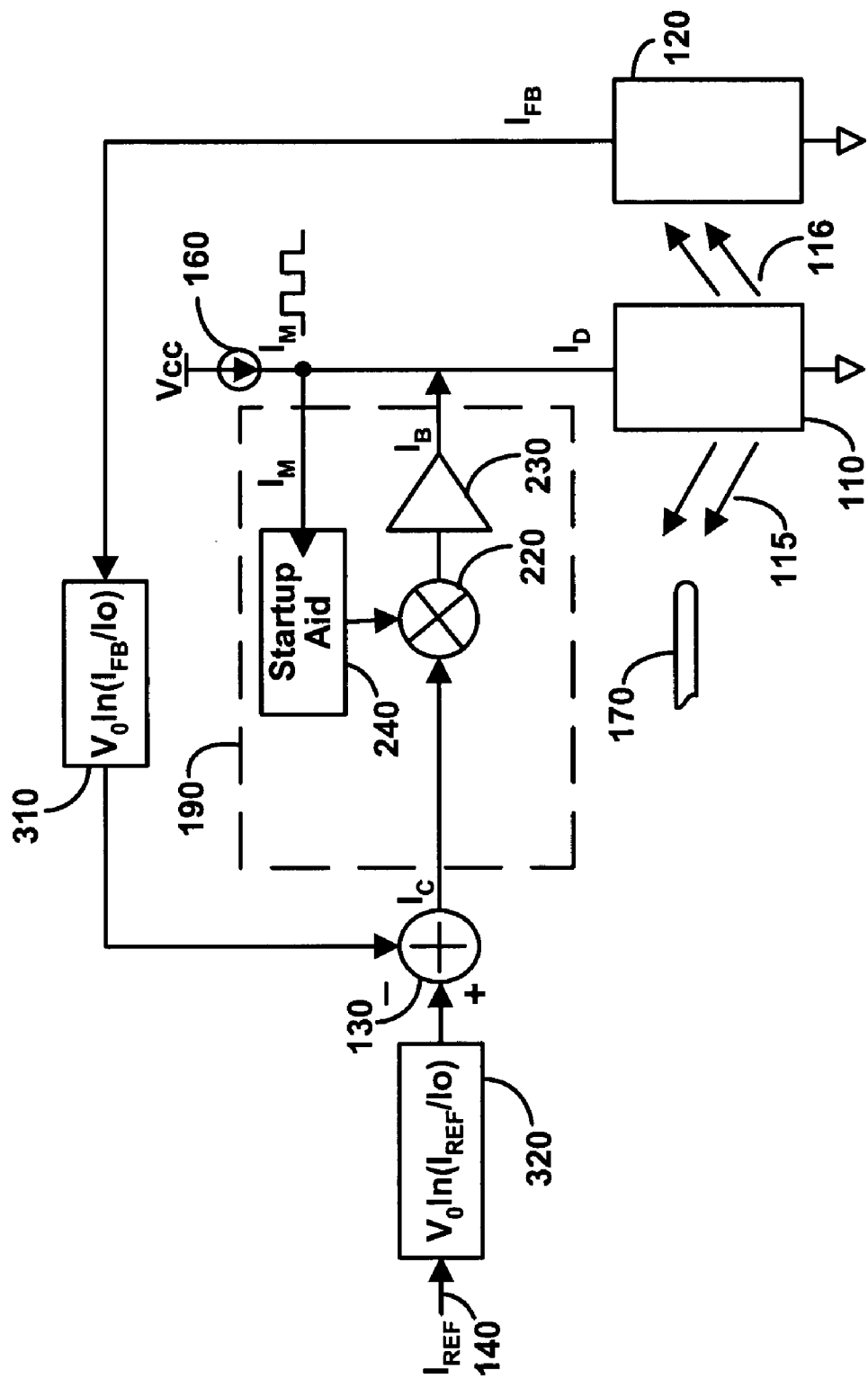
FIG. 6 is another possible alternate embodiment of the system shown in FIG. 2.

FIG. 6 depicts another alternative embodiment (system 300) of the system shown in FIG. 2 in which signal processing block 310 determines the logarithm of the feedback signal $I_{FB}$ before applying it to summing node 130. Thus, block 310 produces a signal $$V_{FB}=V_O*\ln(I_{FB}/I_o) \quad (32)$$

Where Vo and Io are constants. The incremental gain of block 310 is $$dV_{FB}/dI_{FB}=V_O/I_{FB} \quad (33)$$

If the gain of variable gain circuit 190 is given by $$G(s)=A_o/s\tau*I_M \quad (34)$$

Then the loop gain is $$\begin{aligned} A &= G(s)*dV_{FB}/dI_{FB}*dI_{FB}/dI_B \\ &= A_o/V_o/s\tau*I_M*V_o/I_{FB}*dI_{FB}/dI_B \\ &= A_o/s\tau*I_M/I_{FB}*dI_{FB}/dI_B \end{aligned} \quad (35)$$

According to equation 11, $I_{FB}$ is linearly dependent on the quantity $(I_B-I_{TH})$. Thus, the value of $I_{FB}$ may be chosen when evaluating the left-hand side of the equation. Choosing the steady state value for the control system 300 in FIG. 6, we have $I_{FB}=I_{REF}$ and equation 12 may be written as $$A=A_O/s\tau*I_M/I_{REF}*dI_{FB}/dI_B \quad (36)$$

Substituting equation 25 into equation 35 gives $$\begin{aligned} A &= A_o/s\tau*I_M/I_{REF}*I_{REF}/I_M*[1/(E_R-1)+r]^{-1} \\ &= A_o/s\tau*[1/(E_R-1)+r]^{-1} \end{aligned} \quad (37)$$

Equation 37 shows again that the loop gain is independent of γ and η, and is therefore independent of the transfer ratio. One advantage of the alternative embodiment in FIG. 6 is that the variable gain amplifier 190 need only perform multiplication by $I_M$ rather than multiplication by $I_M$ and division by $I_{REF}$ (or $I_{FB}$). Both analog division and digital division are generally more difficult to perform than multiplication. Therefore, it may be preferable to take the logarithm of the feedback signal rather than dividing the control signal by the reference or feedback signal. Taking the logarithm of the feedback signal $I_{FB}$ may also be preferred when $I_{FB}$ has a very wide range of values, because the logarithm function has the well known property of compressing the range of its input signal.

Figure 7:
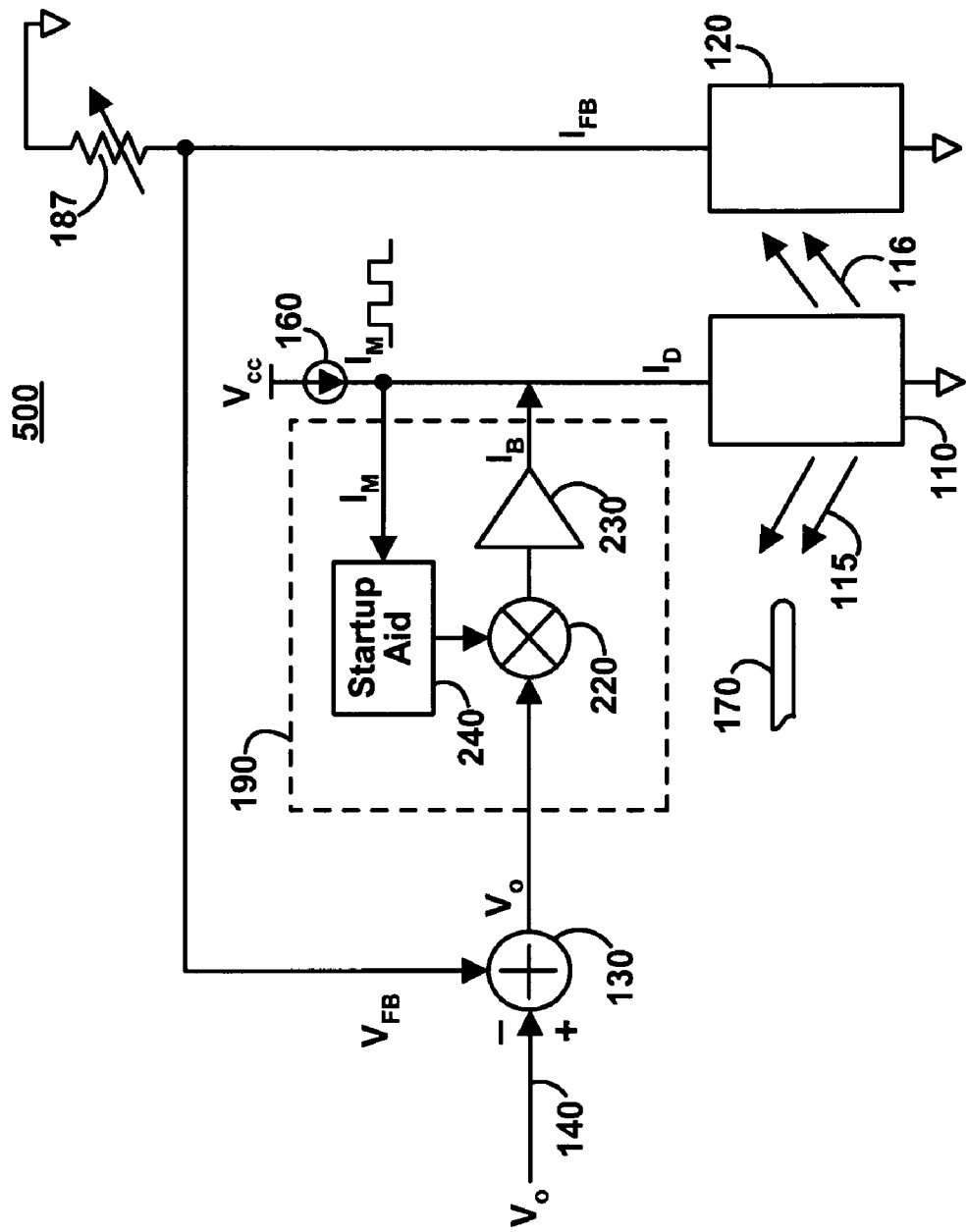
FIG. 7 is schematic of an analog embodiment of the system shown in FIG. 6.

System 500 in FIG. 7 shows another alternative embodiment of the invention. In this case an adjustable resistor 187 with value $R_{FB}$ converts the feedback signal $I_{FB}$ to a voltage $V_{FB}$:

$$V_{FB}=I_{FB}*R_{FB} \quad (38)$$

Resistor 187 is adjusted when system 500 is configured to obtain the desired optical power output $P_{115}$. $V_{REF}$ is a constant voltage.

The small signal gain of resistor 187 is $$dV_{FB}/dI_{FB}=R_{FB} \quad (39)$$

Rearranging equation 38 and combining with equation 39

$$dV_{FB}/dI_{FB}=V_{FB}/I_{FB} \quad (40)$$

In steady state, $V_{FB}$=Vo, so equation 40 can be expressed as $$dV_{FB}/dI_{FB}=V_O/I_{FB} \quad (41)$$

Equation 41 is the same as equation 33. Let the gain of variable gain circuit 185 be given by equation 34. Then we can write the loop gain as $$\begin{aligned} A &= G(s)*dV_{FB}/dI_{FB}*dI_{FB}/dI_B \\ &= A_o/V_o/s\tau*I_M*V_o/I_{FB}*dI_{FB}/dI_B \\ &= A_o/s\tau*I_M/I_{FB}*dI_{FB}/dI_B \end{aligned} \quad (42)$$

In deriving equation 13 it was shown that $I_{FB}$ was equivalent to $I_{REF}$, the value of $I_{FB}$ in steady state. Thus, $I_{REF}$ may be substituted for $I_{FEB}$ in equation 25 and rewrite equation 42 as $$\begin{aligned} A &= G(s)*dV_{FB}/dI_{FB}*dI_{FB}/dI_B \\ &= A_o/V_o/s\tau*I_M*V_o/I_{FB}*I_{FB}/I_M*[1/(E_R-1)+r]^{-1} \\ &= A_o/s\tau*[1/(E_R-1)+r]^{-1} \end{aligned} \quad (42)$$

This is precisely the same result obtained in equations 27 and 37. The loop gain is constant and independent of the highly variable quantities γ and η.

Figure 8:
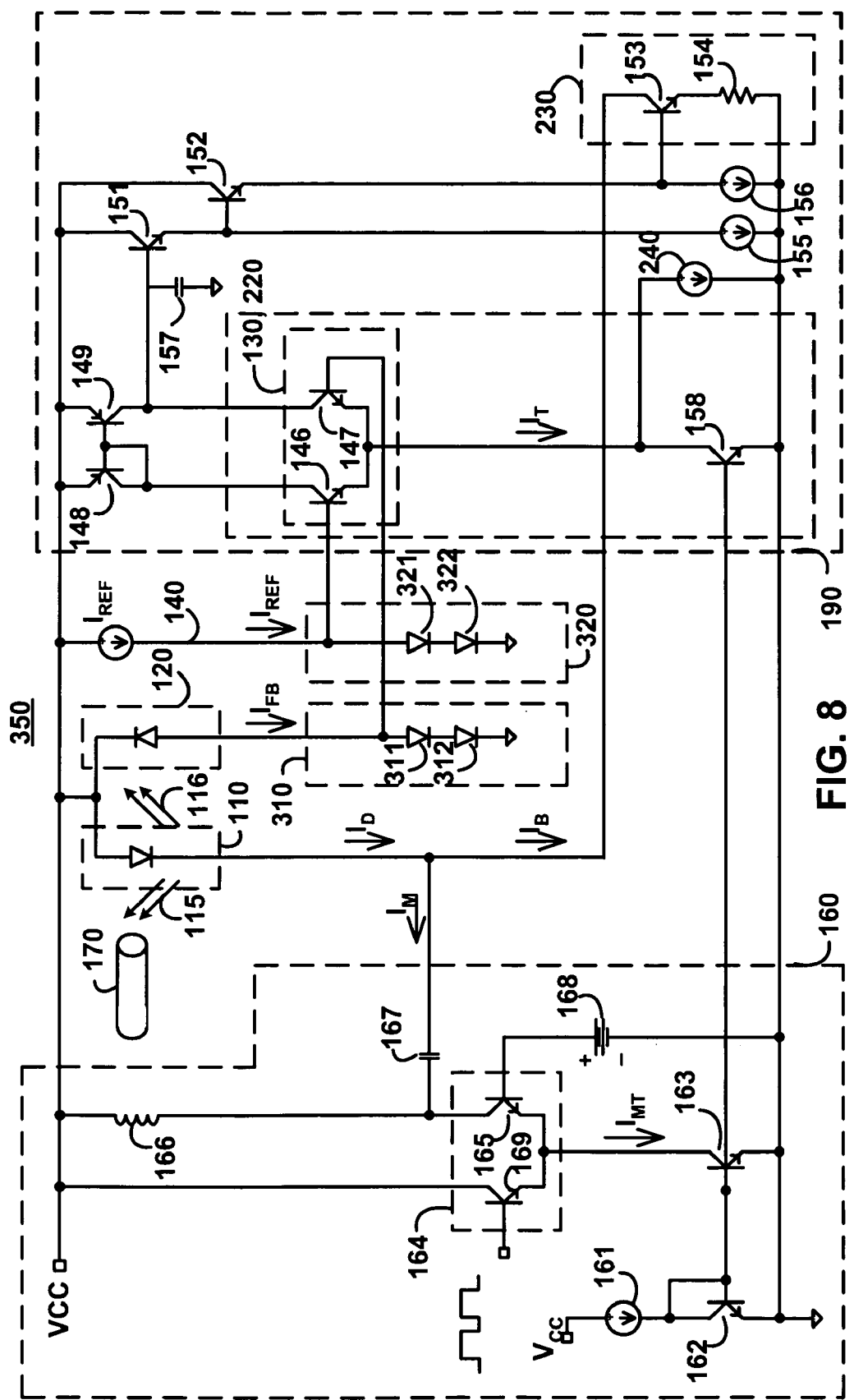
FIG. 8 is schematic of an digital embodiment of the system shown in FIG. 6.

FIG. 8 shows one possible analog circuit implementation 350 of the system shown in FIG. 6. In FIG. 8, light emitter 110 may be a light emitting diode or laser diode. Light detector 120 is a photodiode that generates a current in proportion to the optical output of emitter 110. Diodes 311 and 312 form circuit 310 and generate the logarithm of the detector output. Diodes 321 and 322 in circuit 320 generate the logarithm of the reference current signal 140. Transistors 146 and 147 implement the functions of both summing circuit 130 and multiplying circuit 220 in FIG. 6. Transistors 148 and 149 form a current mirror that determines the difference of the collector currents in transistors 146 and 147 before applying the resulting current to integration capacitor 157.

Darlington connected transistors 151 and 152 buffer the voltage on capacitor 157 and drive voltage-to-current converter 230 (formed by transistor 153 and resistor 154), which supplies bias current $I_B$ to the light emitter 110. Voltage-to-current converter 230 is preferably substantially linear so that its small signal gain is substantially independent of the magnitude of its current output. Current source 240 ensures startup of the bias current in the event that the modulation current and therefore the current in transistor 158 is zero. Current source 240 supplies a substantially constant current that is small compared to the nominal value of current $I_T$.

Block 160 generates the modulation signal in response to a modulated input signal applied to the input node (i.e., the base of transistor 169) of current switch 164. Voltage source 168 provides an appropriate reference so that current switch 164 alternately switches substantially none or substantially all of current $I_{MT}$ into the collector of transistor 165. Inductor 166 and capacitor 167 are preferably large enough that substantially all of the collector current of transistor 169 is routed to modulation signal $I_M$ and therefore to light emitter 110. The high output impedance seen at the collector of transistor 153 ensures that an insignificant portion of modulation signal $I_M$ is absorbed. Current source 161 sets the modulation current level $I_{MT}$ as well as current IT via the current mirror formed by transistors 162, 163, and 158. Transistors 162, 163, and 158 preferably have predetermined relative emitter areas and therefore transistors 163 and 158 generate collector outputs that are in a predetermined ratio to current produced by current source 161.

Figure 9:
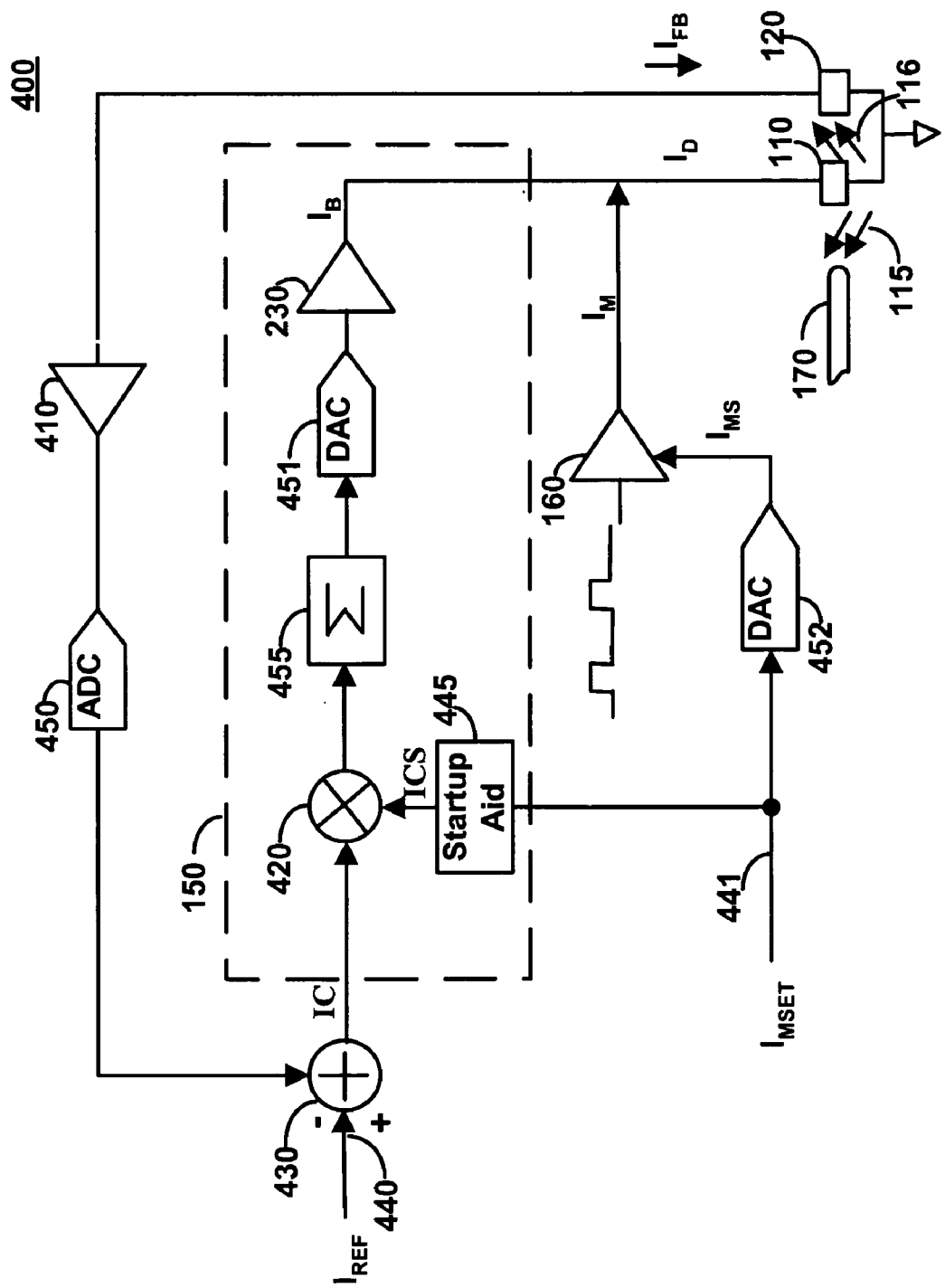
FIG. 9 is schematic of a portion of the digital embodiment shown in FIG. 8.

FIG. 9 shows one possible digital implementation 400 of the system shown in FIG. 5. Modulator 160 amplifies a communications signal, generating modulation signal $I_M$ in proportion to amplitude control signal $I_{MS}$. $I_{MS}$, an analog signal, is generated from digital amplitude control signal 441 ($I_{MSET}$) by digital to analog converter 452. Modulation signal $I_D$ is applied to light emitter 110, which is a light emitting or laser diode. Light detector 120 generates a current $I_{FB}$ in response to optical signal 116 received from the light emitter.

Logarithmic amplifier 410 generates a signal proportional to the logarithm of $I_{FB}$ and applies it to the input of analog to digital converter 450. Digital summing circuit 430 determines the difference of digital reference signal 440 and the digital output of 450 to produce digital control signal $I_C$. Digital multiplier 420 multiplies $I_C$ by amplitude control signal $I_{CS}$, which is proportional to digital amplitude control signal $I_{MSET}$. Startup aid 445, which can be implemented in a variety of ways, ensures that signal $I_{CS}$ and therefore the gain of multiplier 420 is above zero, even when $I_{MSET}$ is zero. The output of multiplier 420 is accumulated by digital accumulator 455, which drives Digital to analog converter 451 and amplifier 230 to generate bias current $I_B$. Bias current $I_B$ drives the light emitter, closing the feedback loop.

Persons skilled in the art will recognize that the apparatus and methods of the present invention may be implemented using circuit configurations other than those shown and discussed above. All such modifications are within the scope of the present invention, which is limited only by the claims that follow.

What is claimed is:

1. A method for controlling an optical output of a lightwave emitter comprising:
   generating an optical output signal with a lightwave emitter;
   detecting at least a portion of the optical output signal with a lightwave detector;
   creating a feedback signal representative of the detected optical output signal;
   producing a control signal based on the feedback signal; and
   compensating for variations in transfer ratio by using a variable gain circuit to automatically adjust a gain of the control signal so that the optical output signal is proportional to a reference signal, wherein the variable gain circuit includes a differential amplifier circuit coupled to a current mirror circuit.

2. The method of claim 1 further comprising providing a modulation signal to modulate the optical output signal.

3. The method of claim 2 wherein the compensating further comprises performing the automatic gain adjustment with respect to the modulation signal.

4. The method of claim 3 further comprising varying an amplitude of the modulation signal with respect to temperature.

5. The method of claim 3 wherein the automatic gain adjustment is based, at least in part, on an amplitude of the modulation signal.

6. The method of claim 3 further comprising generating a drive signal by multiplying the control signal by a signal proportional to an amplitude of the modulation signal.

7. The method of claim 3 wherein the gain provided by the automatic gain adjustment increases as the amplitude of the modulation signal increases.

8. The method of claim 3 wherein the gain provided by the automatic gain adjustment decreases as the amplitude of the modulation signal decreases.

9. The method of claim 2 wherein producing the control signal further comprises subtracting the feedback signal from the reference signal.

10. The method of claim 1 wherein the compensating further comprises performing the automatic gain adjustment with respect to the feedback signal.

11. The method of claim 10 further comprising generating a drive signal by dividing the control signal by a signal proportional to the feedback signal.

12. The method of claim 10 wherein the automatic gain adjustment is based, at least in part, on an average value of the feedback signal.

13. The method of claim 1 wherein the compensating further comprises performing the automatic gain adjustment with respect to the reference signal.

14. The method of claim 13 further comprising generating a drive signal by dividing the control signal by a signal proportional to the reference signal.

15. The method of claim 13 wherein the automatic gain adjustment is based, at least in part, on an average value of the reference signal.

16. The method of claim 1 wherein the automatic gain adjustment maintains a loop gain substantially constant.

17. The method of claim 16 wherein the substantially constant loop gain is selectable.

18. The method of claim 17 further comprising selecting a value for the substantially constant loop gain that optimizes response time.

19. The method of claim 17 further comprising selecting a value for the substantially constant loop gain that optimizes steady-state accuracy.

20. The method of claim 17 further comprising selecting a value for the substantially constant loop gain that optimizes noise rejection.

21. The method of claim 17 further comprising selecting a value for the substantially constant loop gain that optimizes bandwidth.

22. The method of claim 1 further comprising controlling a power of the optical output signal so that the optical output signal power is maintained within a predetermined range.

23. The method of claim 1 further comprising maintaining the reference signal substantially constant.

24. The method of claim 1 wherein the compensating further comprises maintaining the gain of the control signal above a minimum value.

25. The method of claim 1 wherein the compensating further comprises maintaining the gain of the control signal below a maximum value.

26. A method for controlling an optical output of a lightwave emitter comprising:
   generating an optical output signal with the lightwave emitter;
   detecting the optical output signal with a lightwave detector;
   creating a feedback signal representative of the detected output signal;
   producing a control signal based on a value of the detected optical output signal;
   compensating for variations in transfer ratio by using a variable gain circuit to automatically adjust a gain of the control signal to maintain the optical output signal of the lightwave emitter substantially constant, wherein the variable gain circuit includes a differential amplifier circuit coupled to a current mirror circuit.

27. The method of claim 26 further comprising providing a modulation signal to modulate the optical output signal.

28. The method of claim 27 wherein the compensating further comprises performing the automatic gain adjustment with respect to the modulation signal.

29. The method of claim 28 further comprising varying an amplitude of the modulation signal with respect to temperature.

30. The method of claim 28 wherein the automatic gain adjustment is based, at least in part, on an amplitude of the modulation signal.

31. The method of claim 28 further comprising generating a drive signal by multiplying the control signal by a signal proportional to an amplitude of the modulation signal.

32. The method of claim 26 wherein the compensating further comprises performing the automatic gain adjustment with respect to the feedback signal.

33. The method of claim 26 wherein the compensating further comprises performing the automatic gain adjustment with respect to a reference signal.

34. The method of claim 26 wherein the automatic gain adjustment maintains a loop gain substantially constant.

35. The method of claim 34 wherein the substantially constant loop gain is selectable.

36. The method of claim 35 further comprising selecting a value for the constant loop gain that optimizes response time.

37. The method of claim 35 further comprising selecting a value for the constant loop gain that optimizes steady-state accuracy.

38. The method of claim 35 further comprising selecting a value for the constant loop gain that optimizes noise rejection.

39. The method of claim 35 further comprising selecting a value for the constant loop gain that optimizes bandwidth.

40. The method of claim 26 further comprising controlling a power of the optical output signal so that the optical output signal power is maintained within a predetermined range.

41. The method of claim 26 wherein the compensating further comprises maintaining the gain of the control signal above a minimum value.

42. A circuit for controlling an optical output of a lightwave emitter comprising:
a lightwave emitter that generates an optical output signal in response to a drive signal;
a lightwave detector that detects at least a portion of the optical output signal and produces a feedback signal in response to the detected optical signal;
a summing node coupled to a reference signal and to the feedback signal that produces a control signal based on the reference signal and the feedback signal;
a modulator circuit coupled to the lightwave emitter; and
a variable gain circuit coupled to the summing node and to the modulator circuit that produces the drive signal in response to the control signal and compensates for variations in transfer ratio by automatically varying a gain of the control signal, the variable gain circuit comprising a differential amplifier circuit coupled to a current mirror circuit.

43. The circuit defined in claim 42 wherein the variable gain circuit is coupled to the feedback signal.

44. The circuit defined in claim 42 wherein the variable gain circuit is coupled to the reference signal.

45. The circuit defined in claim 42 wherein the lightwave emitter is a vertical cavity surface emitting laser (VCSEL).

46. The circuit defined in claim 42 wherein the lightwave emitter is a laser diode.

47. The circuit defined in claim 42 wherein the lightwave emitter is an edge emitting laser.

48. The circuit defined in claim 42 wherein the lightwave detector is a photodiode.

49. The circuit defined in claim 42 wherein the variable gain circuit includes an analog multiplier circuit.

50. The circuit defined in claim 42 wherein the variable gain circuit includes a logarithmic current to voltage converter.

51. The circuit defined in claim 42 wherein the variable gain circuit includes a digital multiplier circuit.

52. The circuit defined in claim 42 wherein the variable gain circuit includes a divider circuit.

53. The circuit defined in claim 42 wherein the variable gain circuit includes a startup circuit that ensures that a gain of the variable gain circuit does not fall below a minimum value.

54. The circuit defined in claim 42 wherein the variable gain circuit includes a startup circuit that ensures that a gain of the variable gain circuit does not rise above a maximum value.

55. The circuit defined in claim 42 wherein the lightwave detector generates the feedback signal, that is created, at least in part, by a variable resistance.

\* \* \* \* \*